(12) United States Patent
Nakashima et al.

(10) Patent No.: US 10,912,193 B2
(45) Date of Patent: Feb. 2, 2021

(54) STRUCTURE, WIRING BOARD, SUBSTRATE FOR WIRING BOARD, COPPER CLAD LAMINATE, AND METHOD FOR MANUFACTURING THE STRUCTURE

(71) Applicant: KABUSHIKI KAISHA TOSHIBA, Minato-ku (JP)

(72) Inventors: Hajime Nakashima, Hachioji (JP); Izuru Komatsu, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/813,842

(22) Filed: Mar. 10, 2020

(65) Prior Publication Data

US 2020/0214126 A1 Jul. 2, 2020

Related U.S. Application Data

(63) Continuation of application No. PCT/JP2018/028119, filed on Jul. 26, 2018.

(30) Foreign Application Priority Data

Sep. 27, 2017 (JP) .................................. 2017-186332

(51) Int. Cl.
  *H05K 1/03* (2006.01)
  *H05K 3/00* (2006.01)
  *H05K 3/28* (2006.01)

(52) U.S. Cl.
  CPC .......... *H05K 1/0393* (2013.01); *H05K 1/036* (2013.01); *H05K 3/0055* (2013.01); *H05K 3/281* (2013.01); *H05K 2201/0162* (2013.01); *H05K 2203/074* (2013.01); *H05K 2203/0776* (2013.01);
  (Continued)

(58) Field of Classification Search
  CPC ................ H05K 1/0393; H05K 1/036; H05K 2001/0162; H05K 2203/074; H05K 2203/0776; H05K 2203/095; H05K 2203/1173; H03K 3/0055; H03K 3/281
  See application file for complete search history.

(56) References Cited

U.S. PATENT DOCUMENTS 4,344,981 A 8/1982 Imada et al.
2006/0261516 A1* 11/2006 Kunitake ............ C23C 18/1254
                                                            264/259

(Continued)

FOREIGN PATENT DOCUMENTS

JP  51-042553 A  4/1976
JP  56-000831 A  1/1981

(Continued)

OTHER PUBLICATIONS

International Search Report dated Oct. 23, 2018 in PCT/JP2018/028119 filed on Jul. 26, 2018, 2 pages.

*Primary Examiner* — Hoa C Nguyen
(74) *Attorney, Agent, or Firm* — Oblon, McClelland, Maier & Neustadt, L.L.P.

(57) ABSTRACT

According to an embodiment, a structure is provided. The structure comprises a silicone formed product, water, and a protective member. The silicone formed product contains hydroxyl groups in at least a portion of a surface. The water is in contact with at least the portion of the surface containing the hydroxyl groups. The protective member retains the water.

10 Claims, 6 Drawing Sheets

(52) U.S. Cl.
 CPC .............. *H05K 2203/095* (2013.01); *H05K 2203/1173* (2013.01)

(56) References Cited

U.S. PATENT DOCUMENTS

| | | | |
|---|---|---|---|
| 2009/0242048 A1* | 10/2009 | Sherman | C08G 77/455 137/561 R |
| 2012/0292558 A1* | 11/2012 | Kodama | C08L 83/04 252/75 |
| 2015/0205180 A1* | 7/2015 | Yokokawa | G02F 1/167 359/296 |
| 2016/0002407 A1 | 1/2016 | Wakita et al. | |
| 2016/0107376 A1 | 4/2016 | Nakajima et al. | |
| 2016/0250830 A1 | 9/2016 | Kiya et al. | |

FOREIGN PATENT DOCUMENTS

| | | |
|---|---|---|
| JP | 61-036783 B2 | 8/1986 |
| JP | 2001-353804 A | 12/2001 |
| JP | 2005-015599 A | 1/2005 |
| JP | 2007-039547 A | 2/2007 |
| JP | 2010-280911 A | 12/2010 |
| JP | 2011-148263 A | 8/2011 |
| JP | 2012-20441 A | 2/2012 |
| JP | 2015-097257 A | 5/2015 |
| JP | 2015-122448 A | 7/2015 |
| TW | I599596 B | 9/2017 |
| WO | WO 2014/192718 A1 | 12/2014 |
| WO | WO 2015/053309 A1 | 4/2015 |

\* cited by examiner

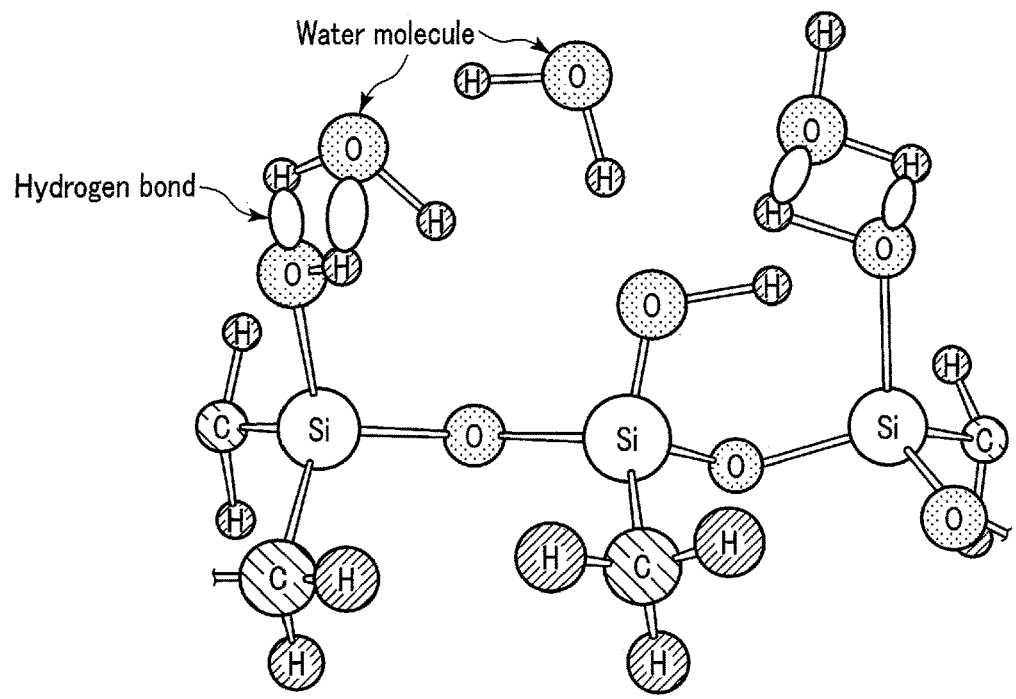
F I G. 3
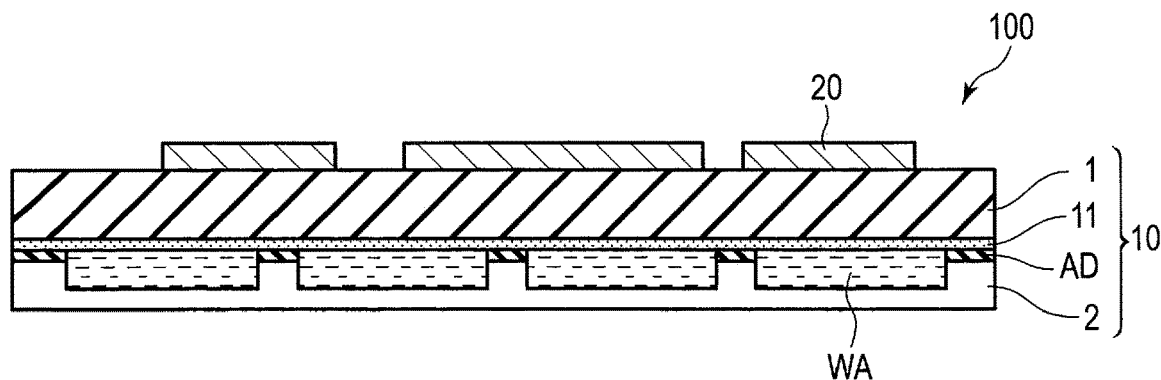
F I G. 4
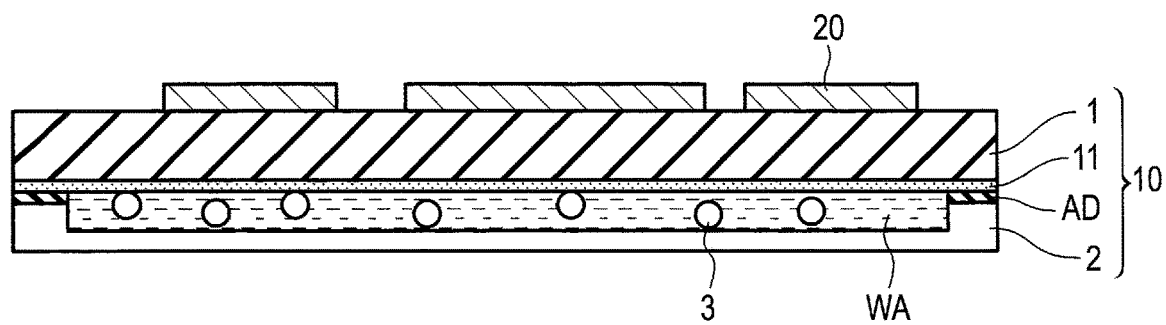
F I G. 5

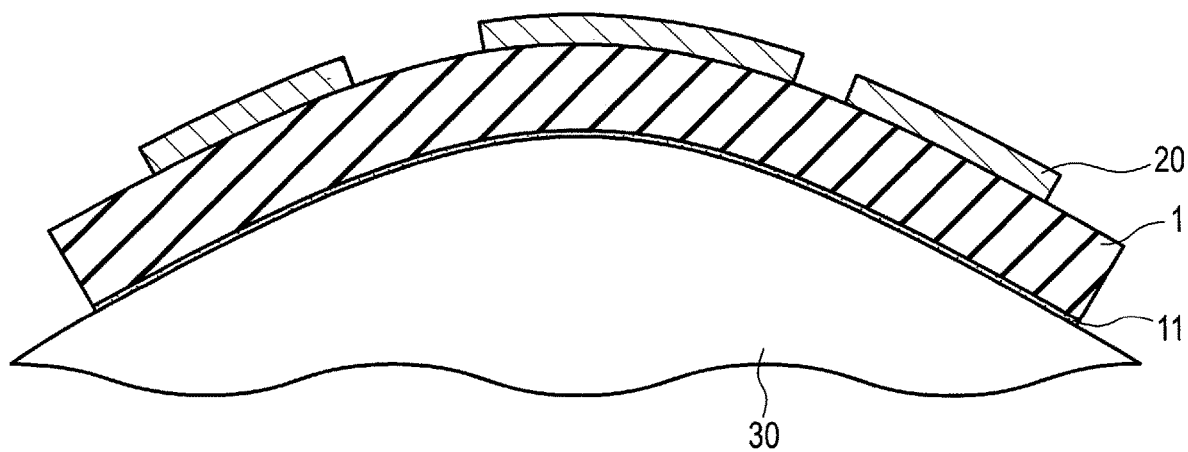
F I G. 6
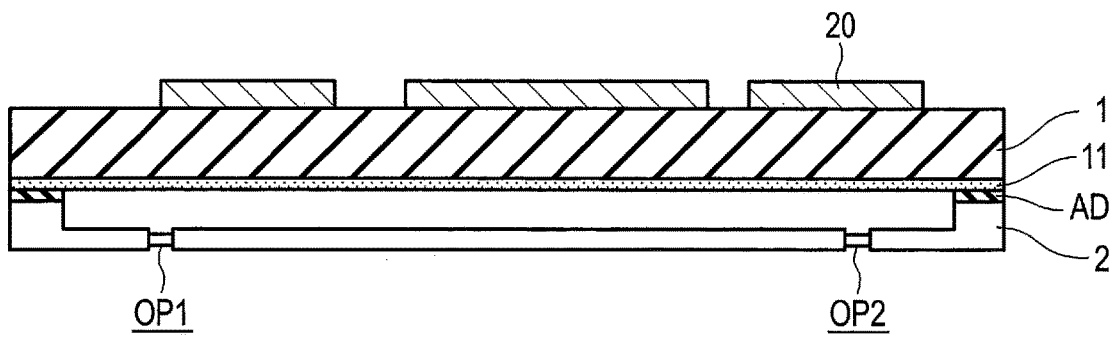
F I G. 7
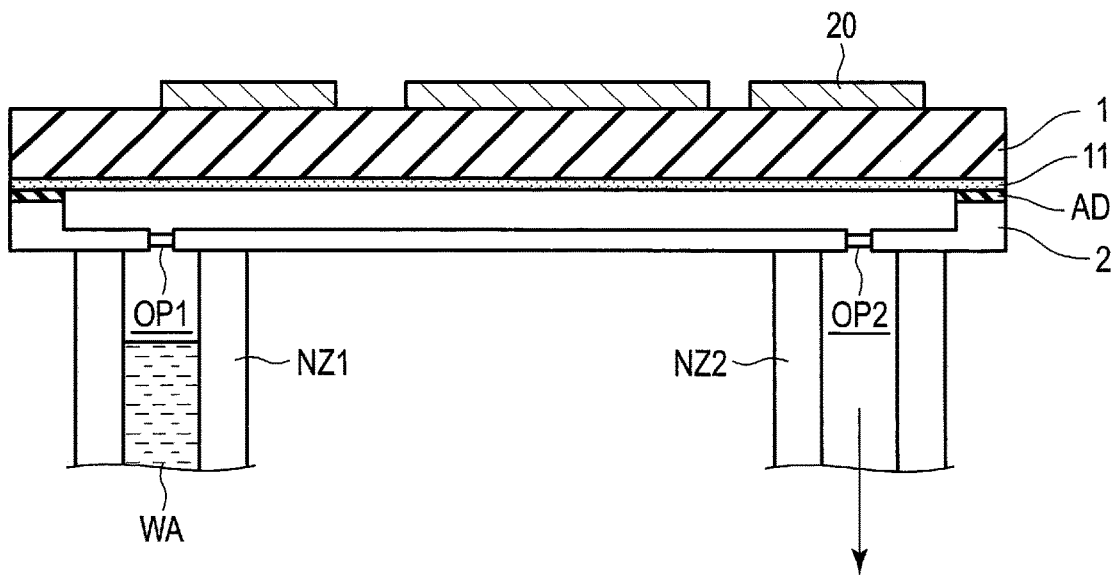
F I G. 8

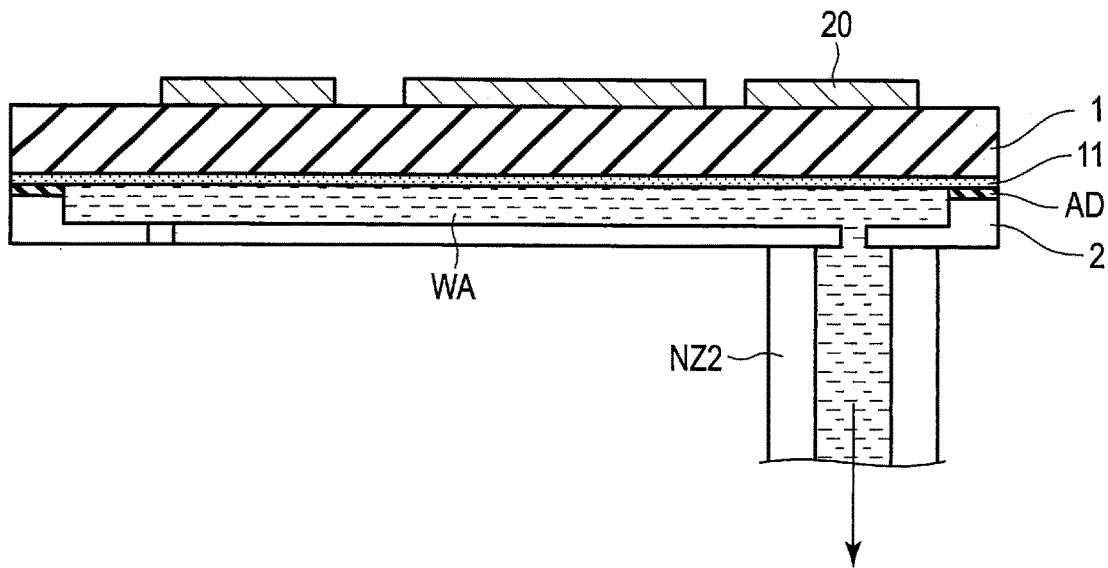
F I G. 11
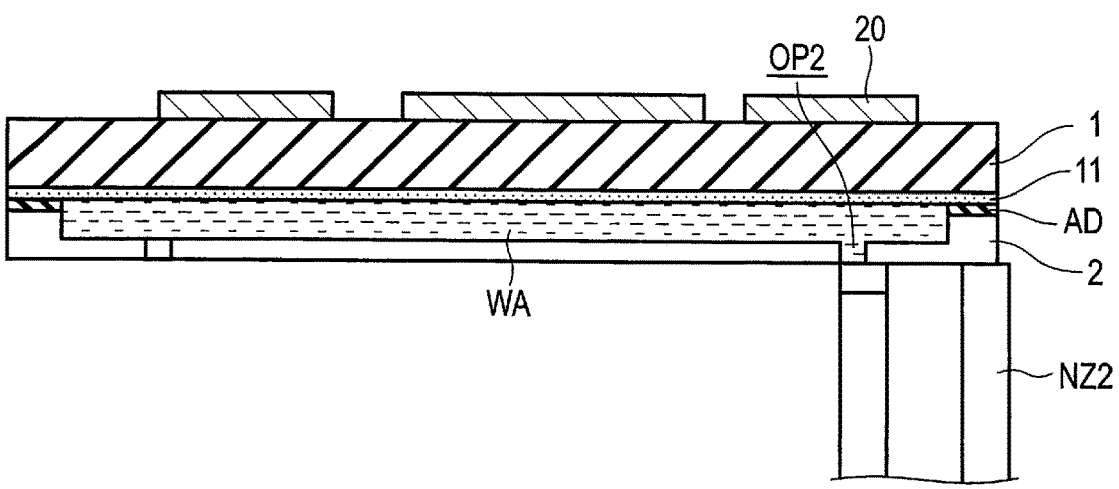
F I G. 12
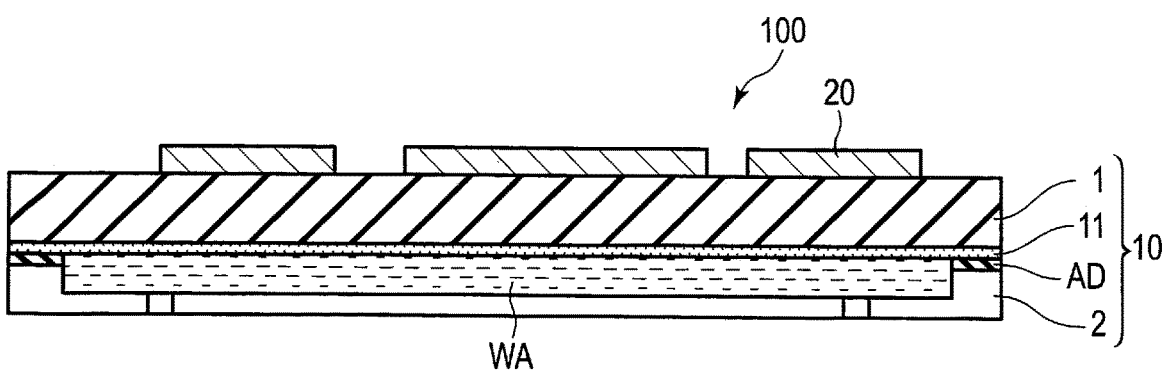
F I G. 13

STRUCTURE, WIRING BOARD, SUBSTRATE FOR WIRING BOARD, COPPER CLAD LAMINATE, AND METHOD FOR MANUFACTURING THE STRUCTURE

CROSS-REFERENCE TO RELATED APPLICATION

This application is a Continuation Application of PCT Application No. PCT/JP2018/028119, filed Jul. 26, 2018 and based upon and claiming the benefit of priority from prior Japanese Patent Application No. 2017-186332, filed Sep. 27, 2017, the entire contents of all of which are incorporated herein by reference.

FIELD

Embodiments described herein relate generally to a structure, a wiring board, a substrate for wiring board, a copper clad laminate, and a method for manufacturing the structure.

BACKGROUND

Printed wiring boards are a part for fixing and wiring electronic parts. Printed wiring boards include a substrate, a conductor pattern which is provided on the substrate and configured to connect electronic parts, and an insulating layer covering a portion of the conductor pattern.

Flexible wiring boards are known as a type of printed wiring boards. In the flexible wiring board, a resin exhibiting flexibility is used for a substrate. In the case of fixing the flexible wiring board to a housing or the like, an adhesive agent or a pressure sensitive adhesive sheet, or parts such as screws and pawls are used. However, in the case of using an adhesive agent or a pressure sensitive adhesive sheet, the adhesive agent or pressure sensitive adhesive sheet may be deteriorated by moisture absorption and the like, which may bring about peeling off of the flexible wiring board from the housing or the like. In addition, in the case of using screws and pawls, there are problems that the number of parts increases and the mold of housing is complicated.

Here, a flexible wiring board has been reported in which a fluororesin of which surface is modified with a silane-based coupling agent is used as a substrate. In addition, a method for improving the hydrophilicity of a silicone resin formed product by subjecting the surface of the silicone resin formed product to plasma treatment has been reported.

BRIEF DESCRIPTION OF THE DRAWINGS

FIG. 3 is a schematic diagram illustrating an example of the steric structure of silicone rubber and water molecules after plasma treatment.

FIG. 4 is a cross-sectional view schematically illustrating an example of a printed wiring board including the structure according to the first embodiment.

FIG. 5 is a cross-sectional view schematically illustrating another example of a printed wiring board including the structure according to the first embodiment.

FIG. 6 is a cross-sectional view schematically illustrating an example of the printed wiring board illustrated in FIG. 4 or 5 which is pasted to an adherend.

FIG. 7 is a cross-sectional view schematically illustrating an example of a method for manufacturing the printed wiring board illustrated in FIG. 4.

FIG. 8 is a cross-sectional view schematically illustrating an example of a method for manufacturing the printed wiring board illustrated in FIG. 4.

FIG. 11 is a cross-sectional view schematically illustrating an example of a method for manufacturing the printed wiring board illustrated in FIG. 4.

FIG. 12 is a cross-sectional view schematically illustrating an example of a method for manufacturing the printed wiring board illustrated in FIG. 4.

FIG. 13 is a cross-sectional view schematically illustrating an example of a method for manufacturing the printed wiring board illustrated in FIG. 4.

DETAILED DESCRIPTION

Figure 1:
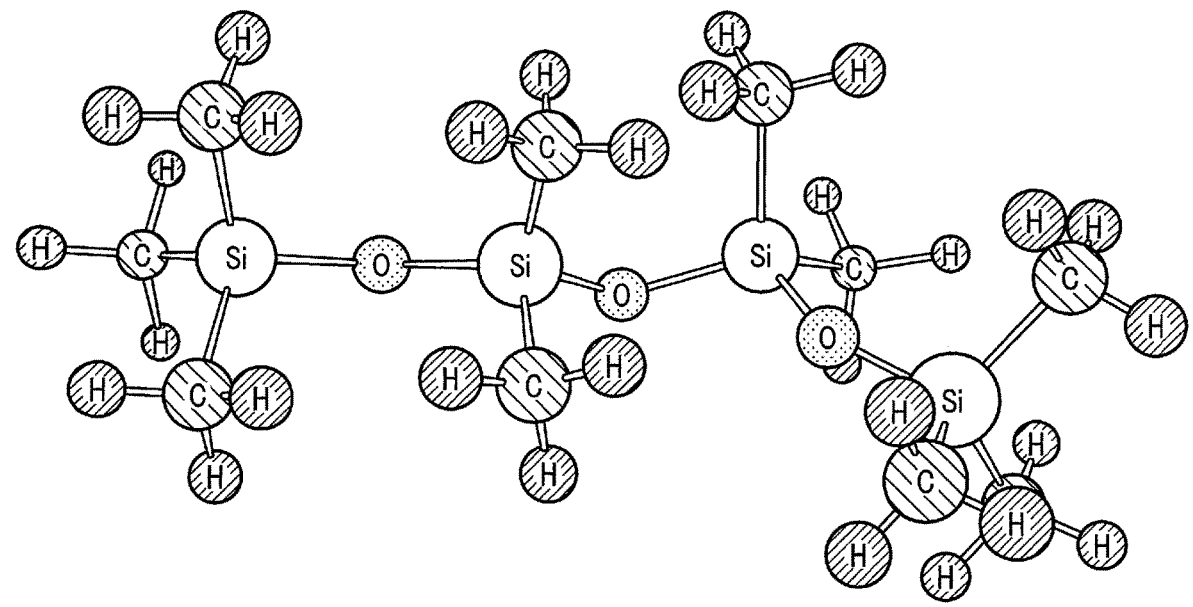
FIG. 1 is a schematic diagram illustrating an example of a steric structure of silicone rubber before being subjected to plasma treatment.

According to an embodiment, a structure is provided. The structure comprises a silicone formed product, water, and a protective member. The silicone formed product contains hydroxyl groups in at least a portion of a surface. The water is in contact with at least the portion of the surface containing the hydroxyl groups. The protective member retains the water.

According to another embodiment, a wiring board is provided. The wiring board comprises the structure according to the embodiment.

According to another embodiment, a substrate for wiring board is provided. The substrate for wiring board comprises the structure according to the embodiment.

According to another embodiment, a copper clad laminate is provided. The copper clad laminate comprises the structure according to the embodiment and a copper foil.

According to another embodiment, a method for manufacturing the structure is provided. The method for manufacturing the structure comprises bringing water into contact with at least some of hydroxyl groups in a silicone formed product containing hydroxyl groups in at least a portion of a surface.

First Embodiment

Hydroxyl groups present on the surface of a silicone formed product impart adhesive property to the silicone formed product. Hence, a silicone formed product having the hydroxyl groups on the surface can be fixed to an adherend such as a housing without using an adhesive agent or a pressure sensitive adhesive sheet, or parts such as screws and pawls. However, the hydroxyl groups present on the surface of a silicone formed product can react with each other to undergo dehydration condensation. For this reason, sufficient adhesive strength was not able to be attained when a silicone formed product having the hydroxyl groups imparted to the surface is stored in the atmosphere for a long time and then brought into contact with an adherend.

The structure according to the first embodiment includes a silicone formed product, water, and a protective member. The silicone formed product contains hydroxyl groups in at least a portion of a surface. The water is in contact with at least the portion of the surface containing the hydroxyl groups. The protective member retains the water.

In the structure according to the first embodiment, the hydroxyl groups present on the surface of the silicone formed product are protected by water. By this, the hydroxyl groups can be present on the surface of the silicone formed product for a long time. For this reason, the structure according to the first embodiment can maintain adhesive property due to the hydroxyl groups for a long time.

Hereinafter, the structure according to the first embodiment will be described in detail.

The structure according to the first embodiment includes a silicone formed product, water, and a protective member.

The silicone formed product contains a synthetic polymer compound having a siloxane bond (Si—O—Si) in the main chain. The silicone formed product preferably contains a polymer compound having a methyl group (—CH₃) in the side chain and more preferably contains a polymer compound having a dimethylsiloxane structure (—Si(CH₃)₂—O—).

As the silicone formed product, for example, silicone rubber and silicone resin can be used. As the silicone rubber or silicone resin, for example, those containing a moiety represented by the following Chemical Formula (1), (2), or (3) can be used. Incidentally, n is, for example, 5000 or more and 10,000 or less.

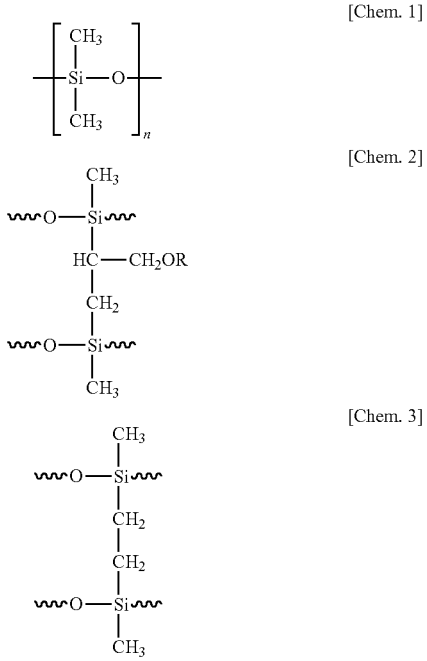

As the silicone rubber, those vulcanized by a known method can be used. The silicone rubber may be one obtained by vulcanizing a silicone rubber compound with an organic peroxide or one obtained by addition vulcanization of a silicone rubber compound with a catalyst such as a platinum compound.

As the silicone rubber compound, for example, KE-941-U or KE-541-U manufactured by Shin-Etsu Chemical Co., Ltd. can be used. As the vulcanizing agent for silicone rubber compound, for example, C-8 or C-25A/B manufactured by Shin-Etsu Chemical Co., Ltd. can be used.

Moreover, as the silicone formed product, silicone resists SWR-PK-01 and SWR-PK-02 manufactured by ASAHI RUBBER INC. or a silicone silver paste ThreeBond 3303G (NEO) manufactured by ThreeBond Fine Chemical Co., Ltd. can be used.

The shape of the silicone formed product is not particularly limited. The shape of the silicone formed product is, for example, a plate shape, a prismatic shape, or a cylindrical shape.

Hydroxyl groups (—OH) are present on at least a portion of the surface of the silicone formed product. The hydroxyl groups may be present on a portion of the surface of the silicone formed product or may be present on the entire surface. The hydroxyl groups are preferably covalently bonded to silicon (Si).

The hydroxyl groups impart adhesive property to the silicone formed product. In other words, a dehydration condensation reaction can take place at the interface between the surface having the hydroxyl groups in the silicone formed product and an adherend when the surface having the hydroxyl groups and the adherend are brought into contact with each other. It is considered that the silicone formed product and the adherend are joined together by this. Moreover, it is considered that the silicone formed product and the adherend are more rigidly joined together in a case where the adherend has the hydroxyl groups on at least a portion of the surface since the hydroxyl groups in the silicone formed product and the hydroxyl groups in the adherend can undergo dehydration condensation.

Figure 2:
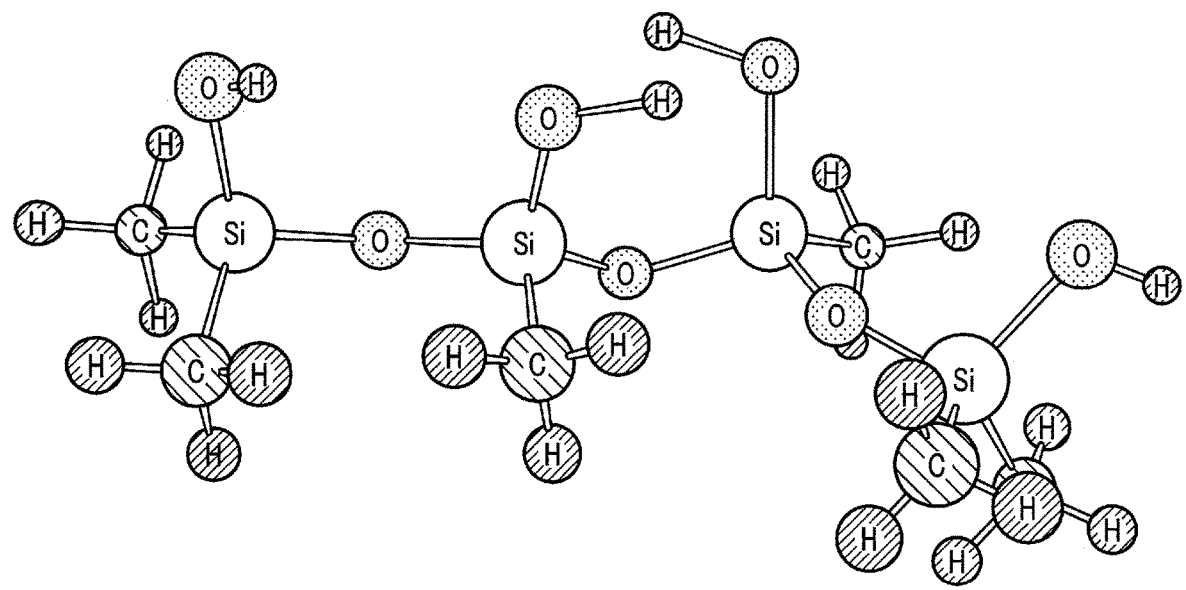
FIG. 2 is a schematic diagram illustrating an example of a steric structure of silicone rubber after being subjected to plasma treatment.

As the method for introducing hydroxyl groups to the surface of the silicone formed product, it is preferable to use plasma treatment. FIG. 1 is a schematic diagram illustrating an example of a steric structure of silicone rubber before being subjected to plasma treatment. FIG. 2 is a schematic diagram illustrating an example of a steric structure of silicone rubber after being subjected to plasma treatment. As illustrated in FIG. 1 and FIG. 2, it is considered that some of the methyl groups in the silicone formed product are substituted with hydroxyl groups by plasma treatment to form a silanol group (Si—O—H).

Incidentally, the method for introducing the hydroxyl groups to the silicone formed product is not limited to the plasma treatment. Examples of a technique for applying energy to modify the surface of the silicone formed product include a treatment by corona discharge, ultraviolet irradiation, or electron beam irradiation. Moreover, hydroxyl groups may be introduced by treating the surface of the silicone formed product with a silane-based coupling agent.

The presence of the hydroxyl groups on the surface of the silicone formed product can be confirmed by X-ray photoelectron spectroscopy (XPS). Specifically, the protective member and water are first removed from the structure according to the first embodiment to expose the surface of the silicone formed product. Subsequently, this exposed surface is subjected to XPS analysis to obtain an XPS spectrum. Upon the measurement, for example, Al-Kα ray is used as the excitation X-ray and the X-ray irradiation diameter is set to 600 μm.

Next, the obtained XPS spectrum is subjected to narrow scan analysis to obtain a narrow scan spectrum related to O1s. Subsequently, the narrow scan spectrum related to O1s is subjected to peak resolution. It is confirmed that a peak appears in a range of 532.4 eV or more and 534.0 eV or less in the spectrum obtained after this peak resolution. This peak is considered to be a peak attributed to a silanol group (Si—OH). This peak appears on the higher energy side than the peak attributed to siloxane bond (Si—O—Si) appearing in a range of 531.4 eV or more and 532.8 eV or less. It can be said that hydroxyl groups are present on the surface of the silicone formed product if the peak attributed to the silanol group (Si—OH) is present.

At least some of hydroxyl groups present on the surface of the silicone formed product are in contact with water. Water prevents degradation in adhesive property of the silicone formed product. The reason for this is considered as follows. First, hydroxyl groups present on the surface of the silicone formed product can undergo dehydration condensation with hydroxyl groups located in the vicinity. By this, the adhesive property of the silicone formed product tends to be degraded when the number of hydroxyl groups present on the surface of the silicone formed product decreases. In particular, it is considered in the silicone formed product that dehydration condensation between hydroxyl groups is likely to take place since the mobility of the main chain is high, and it has been difficult to maintain the adhesive property for a long time.

FIG. 3 is a schematic diagram illustrating an example of the steric structure of silicone rubber and water molecules after plasma treatment. As illustrated in FIG. 3, some of water molecules can form hydrogen bond with some of hydroxyl groups in the silicone formed product. By this, dehydration condensation between the hydroxyl groups present on the surface of the silicone formed product hardly takes place. Hence, it is possible to prevent degradation in adhesive property of the silicone formed product when at least some of the hydroxyl groups present on the surface of the silicone formed product are in contact with water. For this reason, the structure according to the first embodiment can maintain adhesive property for a long time of, for example, 100 hours or more.

As water, pure water, ultrapure water, ion-exchanged water, purified water, tap water, or a mixture thereof can be used. Water may contain an organic solvent other than water. Examples of the organic solvent other than water include alcohol-based solvents such as isopropanol. However, when the proportion of the organic solvent mixed in water is high, the effect of preventing degradation in adhesive property of the silicone formed product tends to be lowered.

The form of water may be liquid or solid. In addition, water may be in the form of highly concentrated water vapor.

The protective member retains water so that water can come into contact with at least some of the hydroxyl groups present on the surface of the silicone formed product.

The shape of the protective member is not particularly limited. The protective member is, for example, detachably mounted on the silicone formed product. The protective member may be, for example, a sheet or container which forms a hollow structure surrounded by the silicone formed product and the protective member by being joined to the silicone formed product. By filling water in this hollow structure, the surface of the silicone formed product and water can be brought into contact with each other. Alternatively, the protective member may be a polymer material forming a gel by being impregnated with water. Water molecules can be supplied to the hydroxyl groups present on the surface of the silicone formed product by bringing the gelled polymer material into contact with at least a portion of the surface of the silicone formed product or locating the gelled polymer material in the vicinity thereof.

The structure according to the first embodiment described above includes a silicone formed product, water, and a protective member. The silicone formed product contains hydroxyl groups in at least a portion of a surface. The water is in contact with at least the portion of the surface containing the hydroxyl groups. The protective member retains the water. For this reason, the structure according to the first embodiment can maintain adhesive property due to the hydroxyl groups for a long time.

In addition, the structure according to the first embodiment can be joined to an adherend by the hydroxyl groups. Hence, the structure according to the first embodiment can fix a silicone formed product to an adherend without using an adhesive agent or a pressure sensitive adhesive sheet, or parts such as screws and pawls.

The applications of the structure according to the first embodiment are not particularly limited. The structure according to the first embodiment can be used in various applications, for example, electrical/electronic related applications such as printed wiring boards, medical related applications such as medical instruments and artificial organs, architectural related applications such as gaskets, daily necessities, nursing care items, sports items, or cooking utensils.

(Printed Wiring Board)

Next, a printed wiring board in which the structure according to the first embodiment is used as a substrate will be described with reference to the drawings. FIG. 4 is a cross-sectional view schematically illustrating an example of a printed wiring board including the structure according to the first embodiment. FIG. 4 is a cross-sectional view given by sectioning the structure according to the first embodiment along a direction orthogonal to the in-plane direction.

A printed wiring board 100 illustrated in FIG. 4 includes a structure 10 according to the first embodiment and a conductor pattern 20. The structure 10 according to the first embodiment includes a substrate 1, a protective member 2, a pressure sensitive adhesive agent AD, and water WA. The substrate 1 includes a hydroxyl group-containing surface 11.

The substrate 1 is made of a plate or rectangular parallelepiped silicone formed product. The silicone formed product is formed, for example, by lamination resulting from pasting of solid silicone sheets or lamination resulting from curing of liquid silicone. The silicone formed product exhibits flexibility. Hence, the printed wiring board 100 can be used as a flexible wiring board. The thickness of the substrate 1 is, for example, 50 μm or more and 500 μm or less.

Moreover, the substrate 1 may be formed on the back surface of a conventional printed wiring board made of a substrate such as an epoxy resin, a polyimide resin, or a phenol resin. In other words, as the substrate 1, a laminated body in which a silicone formed product is laminated on one main surface of a conventional substrate made of an epoxy resin or the like may be used. In this laminated body, the dimensions of the conventional substrate made of an epoxy resin or the like and the dimensions of the silicone formed product may be the same as or different from each other. The thickness of the conventional substrate made of an epoxy resin or the like is, for example, 10 μm or more and 100 μm or less. In the case of joining the laminated body to a non-planar adherend as illustrated in FIG. 6, it is preferable that the thickness of the conventional substrate containing an epoxy resin or the like is thin.

One main surface of the substrate 1 is the hydroxyl group-containing surface 11 containing the hydroxyl groups on the surface. In the printed wiring board 100 illustrated in FIG. 4, the entire surface of one main surface of the substrate 1 contains the hydroxyl groups. The hydroxyl groups may be present only on a portion of one main surface of the substrate 1 or may be present on both main surfaces of the substrate 1. Incidentally, in a case where the substrate 1 is a laminated body of the conventional substrate made of an epoxy resin or the like and a silicone formed product, the hydroxyl groups are present on at least a portion of the main surface in the silicone formed product on the opposite side to the main surface in contact with the conventional substrate.

The protective member 2 is a container provided with an opening and an internal space communicating with this opening. The internal space of this container is divided into four chambers by three partition walls parallel to the direction orthogonal to the in-plane direction. The protective member 2 is joined to one main surface of the substrate 1 via the pressure sensitive adhesive agent AD provided on the upper end portion of the side surface of the container body and the upper end portions of the three partition walls. The protective member 2 is joined to the substrate 1 to form a hollow structure capable of retaining water. In the structure 10 illustrated in FIG. 4, four hollow structures corresponding to four chambers are formed. The number of hollow structures formed by the substrate 1 and the protective member 2 may be singular or plural.

The material for the protective member 2 is preferably a material which exhibits water resistance and does not penetrate water molecules. As the material for the protective member 2, for example, organic materials such as resin and rubber, inorganic materials such as glass and ceramics, or metals can be used.

The pressure sensitive adhesive agent AD is provided at the upper end portion of the side surface of the container body of the protective member 2 and the upper end portions of the three partition walls. The pressure sensitive adhesive agent AD covers a portion of the hydroxyl group-containing surface 11. The pressure sensitive adhesive agent AD detachably adheres the substrate 1 and the protective member 2. In a case where there is a portion uncovered with the hydroxyl group-containing surface 11 in a portion of one main surface of the substrate 1, the pressure sensitive adhesive agent AD may be directly provided on the substrate 1. Moreover, in a case where the substrate 1 and the protective member 2 can be adhered to each other via the hydroxyl group-containing surface 11, the pressure sensitive adhesive agent AD may be omitted.

As the pressure sensitive adhesive agent AD, a known pressure sensitive adhesive agent can be used. As the pressure sensitive adhesive agent AD, those exhibiting water resistance are preferable. As the pressure sensitive adhesive agent AD, for example, an acrylic resin, a urethane resin, and a silicone resin can be used.

The water WA is filled in the hollow structure formed by the substrate 1 and the protective member 2. The water WA protects at least a portion of the hydroxyl group-containing surface 11 from coming into contact with the outside air.

The conductor pattern 20 is provided on the other main surface of the substrate 1. The conductor patterns 20 may be provided on both main surfaces of the substrate 1. The conductor pattern 20 may be provided on the hydroxyl group-containing surface 11, or the hydroxyl group-containing surface 11 may be provided on the conductor pattern 20. Incidentally, in a case where the substrate 1 is a laminated body of the conventional substrate made of an epoxy resin or the like and a silicone formed product, the conductor pattern 20 may be provided on the conventional substrate made of an epoxy resin or the like, on the silicone formed product, or on both of them.

The conductor pattern 20 serves as wiring for connecting electronic parts to each other. The conductor pattern 20 contains a material exhibiting conductivity. The conductor pattern 20 is made of, for example, copper or an alloy containing copper. The conductor pattern 20 can be formed by a known method such as a subtractive method or an additive method. Moreover, the conductor pattern 20 may be formed by a printing method using a conductive ink or a conductive paste. The conductive ink or conductive paste contains, for example, copper or an alloy containing copper, silver or an alloy containing silver, or a conductive filler such as a carbon nanotube, a resin, and a solvent.

At least a portion of the conductor pattern 20 may be covered with an insulating layer (not illustrated). As a material for the insulating layer, for example, resins such as an epoxy resin, a polyimide resin, a silicone resin, and a fluororesin can be used.

FIG. 5 is a cross-sectional view schematically illustrating another example of a printed wiring board including the structure according to the first embodiment. FIG. 5 is a cross-sectional view given by sectioning the structure according to the first embodiment along a direction orthogonal to the in-plane direction. The printed wiring board illustrated in FIG. 5 has the same configuration as that of the printed wiring board illustrated in FIG. 4 except that the hollow structure formed by the substrate 1 and the protective member 2 is one and spacers 3 are included. The protective member 2 illustrated in FIG. 5 is a container provided with an opening and an internal space communicating with this opening.

The printed wiring board 100 illustrated in FIG. 5 includes a plurality of spacers 3. The spacers 3 serve as pillars supporting the protective member 2 so that the substrate 1 and the protective member 2 do not come into close contact with each other. The height of the hollow structure formed by the main surface of the substrate 1 and the bottom inner surface of the protective member 2 can be adjusted by disposing the spacers 3 between the main surface of the substrate 1 and the bottom inner surface of the protective member 2. By this, the amount of water WA contained in the hollow structure can be adjusted.

The spacer 3 has a spherical shape. The shape of the spacer 3 may not be a spherical shape. The spacer 3 may be a cylindrical shape, a prismatic shape, or an indefinite shape.

As the material for the spacer 3, the same material as that for the protective member 2 can be used.

Moreover, the printed wiring board 100 illustrated in FIG. 4 may further include the spacers 3.

Next, an example of the usage of the printed wiring board 100 illustrated in FIGS. 4 and 5 will be described. FIG. 6 is a cross-sectional view schematically illustrating an example of the printed wiring board illustrated in FIG. 4 or 5 which is pasted to an adherend.

First, an adherend 30 illustrated in FIG. 6 is prepared. As the material for the adherend 30, various materials, for example, organic materials such as resin and rubber, inorganic materials such as glass and ceramics, or metals can be used depending on the application. As the material for the adherend 30, silicone rubber, aluminum, stainless steel, or the like can be suitably used.

In the adherend 30, it is preferable that the joining portion to the hydroxyl group-containing surface 11 is clean. The adhesive property of the adherend 30 with the hydroxyl group-containing surface 11 tends to be degraded when there are attached matters such as an organic substance on the surface of the adherend 30.

It is preferable that the joining portion of the adherend 30 has hydroxyl groups. The adhesion between the printed wiring board 100 and the adherend 30 will be more rigid when the joining portion of the adherend 30 has hydroxyl groups.

Hence, it is preferable that the joining portion of the adherend 30 is subjected to plasma treatment. In other words, foreign substances on the surface can be removed when the joining portion of the adherend 30 is subjected to plasma treatment. Moreover, hydroxyl groups can be introduced to the surface of the adherend 30 in a case where the adherend 30 is a silicone formed product. The conditions for plasma treatment of the adherend 30 can be set to be, for example, the same as the conditions for plasma treatment of the structure 10.

Subsequently, the protective member 2 is peeled off from the substrate 1. Subsequently, the water WA attached to the hydroxyl group-containing surface 11 is removed by air blow and the like. This step of removing the water WA may be omitted. Subsequently, the printed wiring board 100 is pasted to the adherend 30 so that the hydroxyl group-containing surface 11 comes into contact with the desired portion of the adherend. It is preferable that this step is quickly performed. This is because it is concerned that the hydroxyl groups easily undergo dehydration condensation on the hydroxyl group-containing surface 11 which leads to degradation in the adhesive property when the printed wiring board 100 is left to stand in a state of absence of the protective member 2. In this manner, the printed wiring board 100 can be rigidly joined to the adherend 30.

Incidentally, a heat treatment may be performed in order to join the printed wiring board 100 and the adherend 30 together more quickly and rigidly. In other words, the dehydration condensation reaction between the hydroxyl groups is promoted and the adhesive property can be quickly enhanced by heating the interface between the printed wiring board 100 and the adherend 30. Specifically, the printed wiring board 100 can be more quickly joined to the adherend 30 by placing the adherend 30 to which the printed wiring board 100 is pasted in a thermostat set to a temperature of 80° C. to 130° C.

Moreover, a load may be applied for a certain time after the printed wiring board 100 and the adherend 30 are joined together. The printed wiring board 100 and the adherend 30 can be joined together more quickly and rigidly by applying the load to the joined body.

In the joined body of the printed wiring board 100 and the adherend 30 thus obtained, the printed wiring board 100 in which the silicone formed product is used as the substrate 1 is rigidly joined to the adherend 30. Hence, the printed wiring board 100 can be pasted to the adherend 30 without using an adhesive agent or a pressure sensitive adhesive sheet, or parts such as screws and pawls even if the shape of the adherend 30 is a shape having a curved surface. In addition, the printed wiring board 100 is rigidly joined to the adherend 30 and thus can follow the shape of the adherend 30 even if the shape of the adherend 30 is deformed by an external force. For this reason, this printed wiring board 100 is hardly peeled off from the adherend 30.

From the above, this printed wiring board 100 can be suitably used as, for example, a wiring board for sensor boards and terminals, healthcare terminals, and wearable terminals, in which silicone rubber and the like are used as the material for the adherend 30.

In a case where silicone rubber is used as the substrate 1 of the printed wiring board 100 and the adherend 30, the joining strength is 1500 kPa or more as an example. There is no particular upper limit value of the joining strength, but the joining strength is 8000 kPa or less as an example.

This joining strength can be measured, for example, by the following method. First, a portion including the joined interface is cut out from the joined body of the substrate 1 and the adherend 30 to obtain a test piece. Subsequently, this test piece is set in a tensile testing machine and pulled at a tensile speed of 10 mm per minute in the direction perpendicular to the joined interface to measure the joining strength. This measurement is conducted 6 times, and the average value thereof is taken as the average joining strength. As the tensile testing machine, for example, AGX-300kNX manufactured by Shimadzu Corporation can be used. The numerical value obtained by this test can be taken as the joining strength between the substrate 1 and the adherend 30.

The printed wiring board 100 described above includes the structure 10 according to the first embodiment. Hence, the printed wiring board 100 can maintain the adhesive property due to hydroxyl groups for a long time. For this reason, users can paste this printed wiring board to an adherend at an arbitrary timing instead of pasting the printed wiring board to the adherend immediately after the hydroxyl groups are imparted to the surface of the silicone formed product.

Incidentally, as an application of the structure 10 according to the first embodiment, the printed wiring board 100 has been described as an example here, but the structure 10 according to the first embodiment can be distributed as a substrate for printed wiring board which does not have the conductor pattern 20. The structure 10 according to the first embodiment can also be used as a copper clad laminate in which a copper foil is clad on the other main surface of the substrate 1 instead of the conductor pattern 20.

Second Embodiment

Next, a method for manufacturing the structure according to the first embodiment will be described.

The manufacturing method according to the second embodiment includes a step of bringing water into contact with at least some of hydroxyl groups in a silicone formed product containing the hydroxyl groups in at least a portion of the surface. The manufacturing method according to the second embodiment may include a step of maintaining a state in which at least some of hydroxyl groups are in contact with water. According to the manufacturing method according to the second embodiment, the structure according to the first embodiment can be obtained.

Hereinafter, the manufacturing method according to the second embodiment will be described in detail.

First, a silicone formed product is prepared. As the silicone formed product, a commercially available product may be used or one cured by adding a vulcanizing agent to a silicone rubber compound may be used.

Next, hydroxyl groups are imparted to at least a portion of the surface of the silicone formed product. As a method for imparting hydroxyl groups, plasma treatment is preferable. Examples of the plasma treatment method include atmospheric pressure plasma treatment, low pressure plasma treatment, high pressure plasma treatment, or in-liquid plasma treatment.

As the plasma treatment, atmospheric pressure plasma treatment using an inert gas as a plasma gas is preferable.

Examples of the inert gas include nitrogen gas, helium gas, or argon gas. As the inert gas, a mixed gas of nitrogen gas and air may be used.

In the plasma treatment, it is preferable to set the diameter of the plasma irradiation port to, for example, 1 mm, the distance from the ejection port to the sample surface, namely, the plasma irradiation distance to 3 mm or more and 15 mm or less, and the plasma irradiation time to 1 second or more and 10 seconds or less. As the plasma treatment apparatus, for example, an atmospheric pressure plasma apparatus DFMJ01 manufactured by Plasma Factory Co., Ltd. can be used.

Next, a protective member is attached so as to cover at least a portion of the surface of the silicone formed product to which hydroxyl groups have been imparted, thereby forming an internal space between the silicone formed product and the protective member. The protective member has an inlet capable of supplying water. Next, water is injected into the internal space through the inlet provided to the protective member.

Next, the inlet provided to the protective member is closed, and water is enclosed in the internal space. In this manner, water and the hydroxyl groups imparted to the surface of the silicone formed product can be brought into contact with each other and the hydroxyl groups can be protected. Moreover, water can be retained for a long time and the hydroxyl groups can be protected for a long time as a container capable of enclosing water is used as a protective member.

An example of the water injecting step will be described in detail with reference to FIG. 7 to FIG. 13. FIG. 7 to FIG. 13 are cross-sectional views schematically illustrating an example of a method for manufacturing the printed wiring board illustrated in FIG. 4. FIG. 7 to FIG. 13 are cross-sectional views given by sectioning the structure according to the first embodiment along a direction orthogonal to the in-plane direction. Incidentally, the partition walls of the protective member 2 illustrated in FIG. 4 are omitted in FIG. 7 to FIG. 13.

First, a structure including a substrate 1, a conductor pattern 20 provided on one main surface of the substrate 1, and a hydroxyl group-containing surface 11 provided on the other main surface of the substrate 1 is prepared. Subsequently, a pressure sensitive adhesive agent AD is applied to a portion of the hydroxyl group-containing surface 11 of this structure. Subsequently, the protective member 2 is joined to the substrate 1 via the pressure sensitive adhesive agent AD as illustrated in FIG. 7. The protective member 2 is a container made of a heat weldable metal material or a laminate film. The pressure sensitive adhesive agent AD may be applied to the upper end portion of the side surface of the container body of the protective member. In this manner, a hollow structure is provided between the protective member 2 and the substrate 1. The protective member 2 is provided with a first opening OP1 and a second opening OP2 which lead to the hollow structure.

Figure 9:
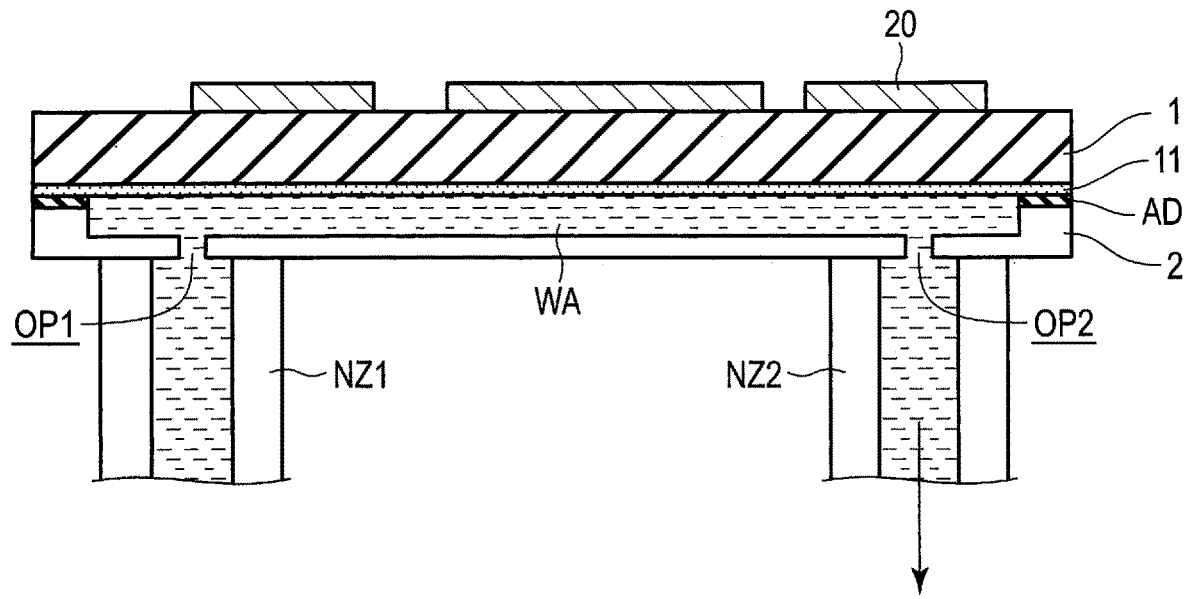
FIG. 9 is a cross-sectional view schematically illustrating an example of a method for manufacturing the printed wiring board illustrated in FIG. 4.

Subsequently, as illustrated in FIG. 8, a first nozzle NZ1 and a second nozzle NZ2 are attached to the first opening OP1 and the second opening OP2, respectively. The first and second nozzles include a heater (not illustrated). The first nozzle NZ1 is connected to a water supply source (not illustrated). The second nozzle NZ2 is connected to a pressure adjusting apparatus (not illustrated). The pressure adjusting apparatus is, for example, a suction apparatus. Subsequently, the pressure adjusting apparatus is operated to lower the pressure inside the hollow structure to a pressure relatively lower than the outside pressure and thus to cause flow of water from the first opening OP1 toward the second opening OP2. The arrow illustrated in FIG. 8 indicates the direction of fluid flow. In this manner, water is filled in the hollow structure as illustrated in FIG. 9.

Figure 10:
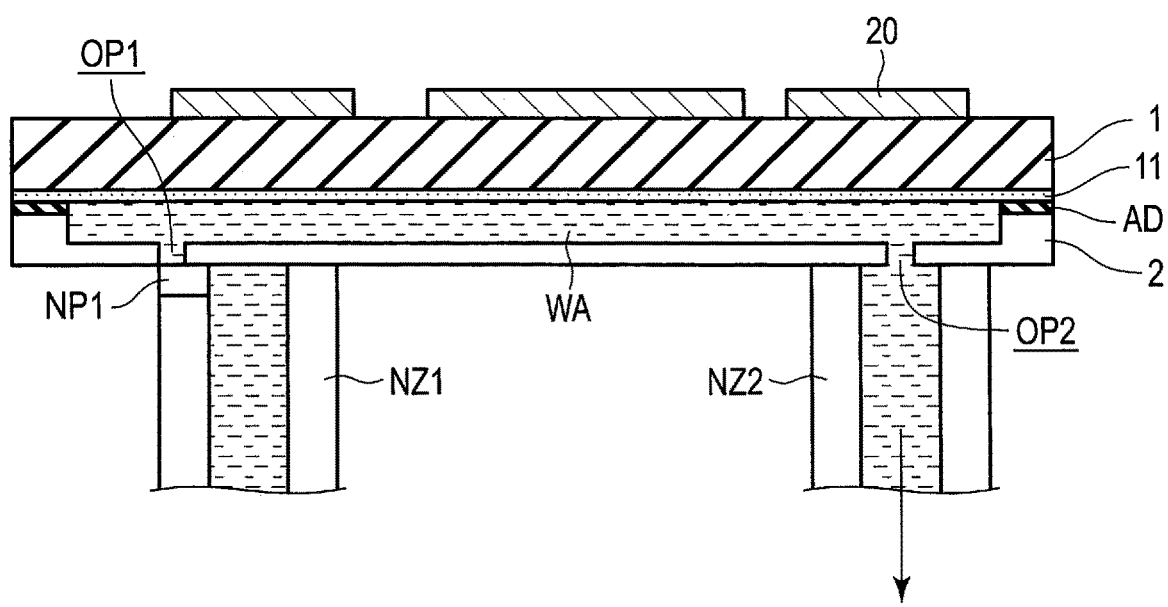
FIG. 10 is a cross-sectional view schematically illustrating an example of a method for manufacturing the printed wiring board illustrated in FIG. 4.

Subsequently, the first opening OP1 is closed with a portion NP1 of the first nozzle NZ1 by shifting the position of the first nozzle NZ1 in the in-plane direction as illustrated in FIG. 10. Subsequently, the heater of the first nozzle NZ1 is operated to heat the portion NP1 of the first nozzle NZ1. By this, a portion of the protective member 2 is welded, and the first opening OP1 is closed as illustrated in FIG. 11.

Subsequently, as illustrated in FIG. 12, the second opening OP2 is also closed in the same manner as the first opening OP1. Specifically, the position of the second nozzle NZ2 is first shifted in the in-plane direction, and the second opening OP2 is closed with a portion NP2 of the second nozzle NZ2. Subsequently, the heater of the second nozzle NZ2 is operated to heat the portion NP2 of the second nozzle NZ2 and thus to weld a portion of the protective member 2. In this manner, the second opening OP2 is closed, and the structure 10 in which the water WA is filled in the hollow structure can be obtained as illustrated in FIG. 13.

Incidentally, the method for supplying water to at least a portion of the surface of the silicone formed product to which hydroxyl groups have been imparted is not limited to the method described above. For example, water or a gel containing water may be applied to at least a portion of the surface of the silicone formed product to which hydroxyl groups has been imparted using a spray and the like. By covering the surface of the silicone formed product with a protective member thereafter, water can be confined and the hydroxyl groups on the silicone formed product can be protected by the water.

The manufacturing method according to the second embodiment described above includes a step of bringing water into contact with at least some of hydroxyl groups in the silicone formed product containing the hydroxyl groups in at least a portion of the surface. According to the manufacturing method according to the second embodiment, the structure according to the first embodiment can be obtained.

EXAMPLES

Hereinafter, Examples of the present embodiments will be described.

Example 1

The same structure as that illustrated in FIG. 4 was fabricated except that the conductor pattern was omitted. Specifically, a substrate 1 made of a silicone formed product was first prepared. As the silicone formed product, one obtained by curing a rubber compound with a vulcanizing agent was used. As the rubber compound, a rubber compound KE-541-U manufactured by Shin-Etsu Chemical Co., Ltd. was used. As the vulcanizing agent, C-25A/B manufactured by Shin-Etsu Chemical Co., Ltd. was used. The shape of the substrate 1 was a cubic shape having a side of 15 mm and a height of 15 mm.

Next, the surface of this substrate 1 was subjected to plasma treatment to provide a hydroxyl group-containing surface 11. Upon the plasma treatment, the type of plasma gas was nitrogen, the diameter of the plasma irradiation port was set to 1 mm, the gas flow rate was set to 10 L/mm, the irradiation distance was set to 5 mm, and the irradiation time was set to 10 seconds. As the plasma apparatus, an atmospheric pressure plasma apparatus DFMJ01 manufactured by Plasma Factory Co., Ltd. was used.

Next, a container having an inlet at the bottom face portion was prepared as the protective member 2. The bottom face of the container was in a square shape having a side of 15 mm, and the height of the container was 1 mm. The material for the container was a rubber compound KE-541-U manufactured by Shin-Etsu Chemical Co., Ltd. to be the same as that for the substrate 1.

Next, the pressure sensitive adhesive agent AD was applied to the upper end portion of the side surface of the container body of the protective member 2. As the pressure sensitive adhesive agent AD, a silicone-based pressure sensitive adhesive agent manufactured by Shin-Etsu Chemical Co., Ltd. was used.

Next, the protective member 2 was joined to the substrate 1 via the pressure sensitive adhesive agent AD. Next, pure water was injected into the interior through the inlet at the bottom face portion of the protective member 2, and then the inlet was sealed to enclose the pure water. The amount of pure water injected into the interior was 0.1 ml. In this manner, a structure A was obtained.

Example 2

A structure B was obtained by the same method as that described in Example 1 except that the injection of pure water was omitted.

Example 3

A structure C was obtained by the same method as that described in Example 1 except that isopropyl alcohol (IPA) was injected instead of pure water.

(Test for Evaluation on Adhesive Property Maintenance)

The structure A obtained in Example 1 was left to stand in the atmosphere at normal temperature for the test time. Subsequently, the protective member 2 was peeled off and the pure water was removed after the test time elapsed to obtain a test piece. Two test pieces were prepared. Subsequently, the two test pieces were stacked one on the other so that the plasma treatment surfaces of the two test pieces were in contact with each other. Subsequently, a load of 40 N (0.18 MPa) was applied to the test pieces stacked one on the other in the vertical direction, and then the test pieces stacked were placed in a thermostat at 120° C. for 1 hour in a state in which the load was not applied thereto. Subsequently, the test pieces after being heated were subjected to a tensile test by the method described above, and the average joining strength thereof was measured.

Moreover, the fracture mode point was evaluated by visually observing the test pieces after being subjected to joining strength measurement. The relation between the fracture mode point and the appearance of the test piece was set as follows. The average value when the tensile test was conducted 6 times was taken as the fracture mode point.

9 points: Fracture was not observed on joining surface and fracture was observed inside test piece.

3 points: Fracture was observed at a portion of joining surface but fracture was almost observed inside test piece.

1 point: Fracture was almost observed on joining surface but fracture was also partially observed inside test piece.

0 point: Fracture was observed only on joining surface.

In the above test, the test was conducted by setting the test time to 2 hours, 6 hours, 12 hours, 24 hours, and 168 hours, respectively. The structures corresponding to the respective test times were assigned as test pieces A1 to A5, respectively.

Moreover, the adhesive property of the structures B obtained in Example 2 were evaluated by the same method as above where one subjected to the above test immediately after plasma treatment was assigned as a test piece B1 and one subjected to the above test after being left to stand in the atmosphere at normal temperature for 2 hours was assigned as a test piece B2.

Moreover, the adhesive property of the structure C obtained in Example 3 was evaluated by the same method as above where one subjected to the above test after 24 hours elapsed from the IPA injection was assigned as a test piece C1.

Figure 14:
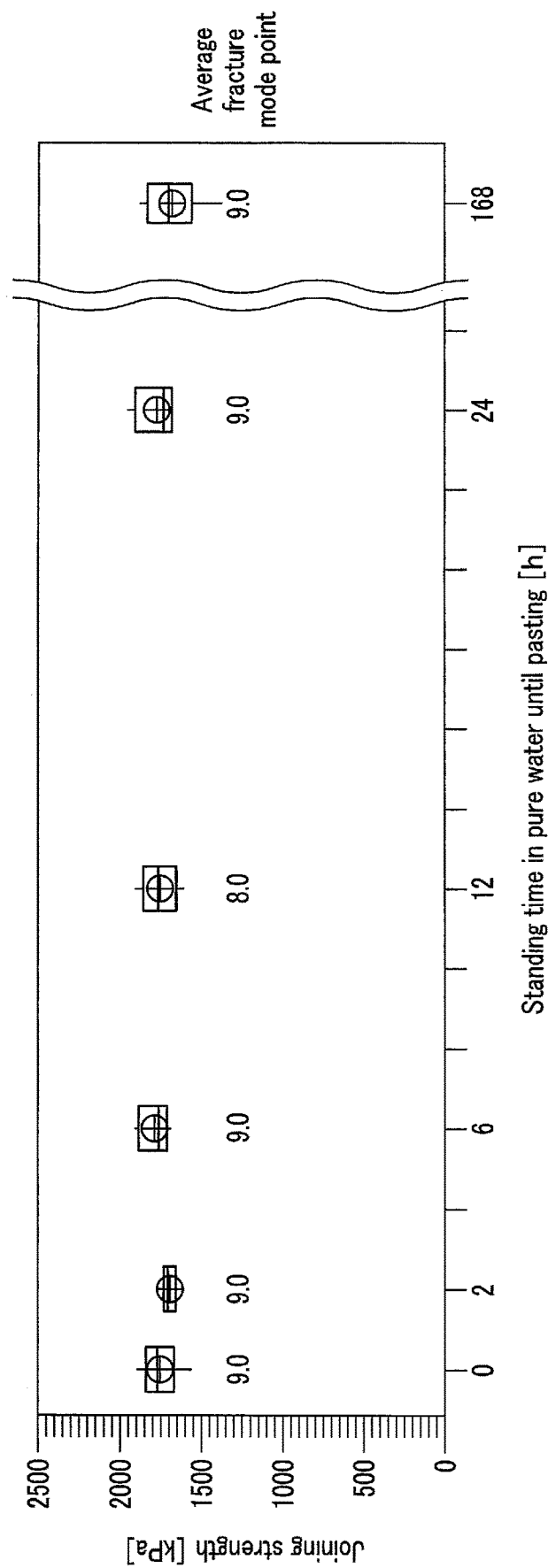
FIG. 14 is a graph illustrating an example of the relation between standing time in water and joining strength.

The results are summarized in Table 1 and FIG. 14.

TABLE 1

| | Silicone formed product | | | Conditions before pasting | | Test results | |
|---|---|---|---|---|---|---|---|
| | Type | Crosslinking agent | Adherend | Environment | Time | Average joining strength (kPa) | Average fracture mode point |
| Test piece A1 | KE541U | C-25A/B | Silicone rubber | Water | 2 | 1702.9 | 9.0 |
| Test piece A2 | KE541U | C-25A/B | Silicone rubber | Water | 6 | 1796.7 | 9.0 |
| Test piece A3 | KE541U | C-25A/B | Silicone rubber | Water | 12 | 1772.2 | 8.0 |
| Test piece A4 | KE541U | C-25A/B | Silicone rubber | Water | 24 | 1795.6 | 9.0 |
| Test piece A5 | KE541U | C-25A/B | Silicone rubber | Water | 168 | 1694.9 | 9.0 |
| Test piece B1 | KE541U | C-25A/B | Silicone rubber | Atmosphere | 0 | 1763.1 | 9.0 |
| Test piece B2 | KE541U | C-25A/B | Silicone rubber | Atmosphere | 2 | 423.1 | 0.0 |
| Test piece C | KE541U | C-25A/B | Silicone rubber | IPA | 24 | 0.0 | 0.0 |

In Table 1 above, the type of silicone compound is described in the row denoted as "Type" among the rows below the heading "Silicone formed product". In addition, the type of crosslinking agent is described in the row denoted as "Crosslinking agent".

In addition, the material for the adherend to which each test piece was joined is described in the row below the heading "Adherend".

In addition, the environment in which the hydroxyl group-containing surface of the test piece was left to stand until to be pasted to the adherend is described in the row denoted as "Environment" among the rows below the heading "Conditions before pasting." In addition, the test time during which the test piece is left to stand in each environment until to be pasted to the adherend is described in the row denoted as "Time".

In addition, the average joining strength obtained by the above-described method is described in the row denoted as "Average joining strength (kPa)" among the rows below the heading "Test results". In addition, the average fracture mode point obtained by the above-described method is described in the row written as "Average fracture mode point".

FIG. 14 is a graph illustrating an example of the relation between standing time in water and joining strength. In the graph of FIG. 14, the horizontal axis indicates the standing time in pure water until pasting, the vertical axis at the left end of the graph indicates the average joining strength, and the vertical axis at the right end of the graph indicates the average fracture mode point. FIG. 14 is created based on the data relating to the test pieces A1 to A5 and the test piece B1.

As is apparent from Table 1 and FIG. 14, the average joining strengths and average fracture mode points relating to the test pieces A1 to A5 of which hydroxyl group-containing surface was stored in water after plasma treatment were almost the same as the average joining strength and average fracture mode point of the test piece B1 joined immediately after plasma treatment. In other words, the adhesive force was not degraded in a case where the test piece after being subjected to plasma treatment was stored in water for a long time of 24 hours or more before being pasted to the adherend. In contrast, the average joining strengths and average fracture mode points of the test piece B2 of which hydroxyl group-containing surface was stored in the atmosphere and the test piece C1 of which hydroxyl group-containing surface was stored in IPA were remarkably lower than the average joining strengths and average fracture mode points of the test pieces A1 to A5.

According to at least one embodiment described above, a structure is provided. The structure comprises a silicone formed product, water, and a protective member. The silicone formed product contains hydroxyl groups in at least a portion of a surface. The water is in contact with at least the portion of the surface containing the hydroxyl groups. The protective member retains the water. For this reason, the structure according to the embodiments can maintain adhesive property due to hydroxyl groups for a long time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A structure, comprising:
    a silicone formed product containing silanol groups in at least a portion of a surface;
    water in contact with at least the portion of the surface containing the silanol groups; and
    a protective member for retaining the water.

2. The structure according to claim 1, wherein the silicone formed product is silicone rubber.

3. The structure according to claim 1, wherein the structure has an internal space defined by at least the portion of the surface containing the silanol groups of the silicone formed product and the protective member and the water is accommodated in the internal space.

4. A wiring board comprising the structure according to claim 1.

5. The wiring board according to claim 4, further comprising a conductor pattern.

6. A substrate for a wiring board comprising the structure according to claim 1.

7. A copper clad laminate comprising the structure according to claim 1 and a copper foil.

8. A method for manufacturing a structure, the method comprising:
    bringing water into contact with at least some of silanol groups in a silicone formed product containing the silanol groups in at least a portion of a surface; and
    providing a protective member to retain the water.

9. The method for manufacturing a structure according to claim 8, wherein the silanol groups are imparted to the silicone formed product by a plasma treatment.

10. A method for manufacturing a structure, the method comprising:
    bringing water into contact with at least a portion of a surface of a silicone formed product containing silanol groups in at least a portion of the surface; and
    providing a protective member to retain the water.

* * * * *